(12) United States Patent
Lee et al.

(10) Patent No.: US 9,564,354 B2
(45) Date of Patent: Feb. 7, 2017

(54) VIA-HOLE ETCHING METHOD

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventors: Byung Chun Lee, Beijing (CN); Donghua Jiang, Beijing (CN); Yongyi Fu, Beijing (CN); Wuyang Zhao, Beijing (CN); Chundong Li, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan (CN)

( * ) Notice: Subject to any disclaimer, the term of this patent is extended or adjusted under 35 U.S.C. 154(b) by 0 days.

(21) Appl. No.: 14/361,083

(22) PCT Filed: Dec. 3, 2013

(86) PCT No.: PCT/CN2013/088465
§ 371 (c)(1),
(2) Date: May 28, 2014

(87) PCT Pub. No.: WO2015/027596
PCT Pub. Date: Mar. 5, 2015

(65) Prior Publication Data
US 2015/0303099 A1    Oct. 22, 2015

(30) Foreign Application Priority Data
Aug. 30, 2013    (CN) .......................... 2013 1 0389494

(51) Int. Cl.
*H01L 21/768*    (2006.01)
*H01L 21/3213*    (2006.01)
*H01L 21/311*    (2006.01)

(52) U.S. Cl.
CPC ... *H01L 21/76804* (2013.01); *H01L 21/31116* (2013.01); *H01L 21/31144* (2013.01); *H01L 21/32139* (2013.01); *H01L 21/76895* (2013.01)

(58) Field of Classification Search
CPC .................... H01L 21/76804; H01L 21/76895; H01L 21/31144; H01L 21/32139; H01L 21/76897; H01L 21/31116; H01L 21/76831; H01L 21/76826; H01L 21/76807; H01L 2221/1031; H01L 21/31138; H01L 21/76832
(Continued)

(56) References Cited

U.S. PATENT DOCUMENTS 5,741,741 A * 4/1998 Tseng ............................ 438/637
6,284,642 B1 * 9/2001 Liu et al. ...................... 438/622
(Continued)

FOREIGN PATENT DOCUMENTS

| CN | 1604288 A | 4/2005 |
| CN | 101894791 A | 11/2010 |
| JP | 2007-019393 A | 1/2007 |

OTHER PUBLICATIONS

International Search Report Issued Jun. 13, 2014; Appln. No. PCT/CN2013/088465.
(Continued)

*Primary Examiner* — Caleen Sullivan
(74) *Attorney, Agent, or Firm* — Ladas & Parry LLP

(57) ABSTRACT

The present invention discloses a via-hole etching method related to semiconductor manufacturing field, and the
(Continued)

method overcomes the defects of an uncontrollable end point of a via-hole and an unfavorable profile-angle in a conventional via-hole etching method. The via-hole etching method includes: forming a structure for via-hole etching, includes: a low-temperature poly-silicon layer, a gate insulating layer, a gate metal layer and an interlayer insulating layer, which are sequentially formed on a substrate; forming a mask layer comprising a via-hole masking pattern on the structure for via-hole etching; by using a first etching process, etching the structure for via-hole etching to a first thickness of the gate insulating layer; by using a second etching process, etching the structure for via-hole etching to etch away the remaining thickness of the gate insulating layer, and uncovering the low-temperature poly-silicon layer; removing the mask layer to form a via-hole structure.

16 Claims, 2 Drawing Sheets

(58) Field of Classification Search
USPC .......................................................... 438/701
See application file for complete search history.

(56) References Cited

U.S. PATENT DOCUMENTS

| 2003/0064601 | A1 | 4/2003 | Thompson |
| 2005/0118827 | A1 | 6/2005 | Sato et al. |
| 2005/0260804 | A1* | 11/2005 | Kang ............... H01L 21/76804 438/164 |
| 2007/0066074 | A1* | 3/2007 | Rossi et al. .................. 438/706 |

OTHER PUBLICATIONS

First Chinese Office Action dated Jul. 8, 2015; Appln. No. 201310389494.2.
Second Chinese Office Action dated Feb. 1, 2016; Appln. No. 201310389494.2.
International Preliminary Report on Patentability issued Mar. 1, 2016; PCT/CN2013/088465.

* cited by examiner

VIA-HOLE ETCHING METHOD

TECHNICAL FIELD

Embodiments of the present invention relate to semiconductor manufacturing field, and particularly to a via-hole etching method.

BACKGROUND

In recent years, as applications of display products become more widely, the studies for display technology also have become more deeply. As a new manufacturing process, LTPS (Low Temperature Poly-Silicon) technology utilizes an excimer laser annealing process to convert an amorphous silicon (a-Si) layer into a poly-silicon (poly-Si) thin film layer. Compared with an amorphous silicon material, a poly-silicon material has increased electron mobility by 100 times or more; therefore, the use of LTPS technology can achieve faster response time, higher resolution and better screen-display quality. Moreover, the use of LTPS technology can reduce integration circuits, simplify periphery of a display device, and implement a narrow-frame technique.

FIG. 1 presents an array-substrate intermediate structure employing LTPS, and as illustrated in FIG. 1, the intermediate structure comprises: a substrate 1, a low-temperature poly-silicon layer 2, a gate insulating layer 3, a gate metal layer 4, an interlayer insulating layer 5 and source-drain via-holes 6, etc. For preparation of the above-described array-substrate intermediate structure, via-holes as illustrated in FIG. 1 are formed, and typically, the etching for the via-holes is accomplished by dry etching or wet etching in a conventional etching method.

SUMMARY

Embodiments of the present invention provide a via-hole etching method, which overcomes the defects of an uncontrollable end point of a via-hole and an unfavorable profile-angle in a conventional via-hole etching method.

To solve the above-mentioned technical problems, the embodiments of the present invention adopts technical solutions as follows:

A via-hole etching method comprises: forming a structure for via-hole etching, comprising a low-temperature poly-silicon layer, a gate insulating layer, a gate metal layer and an interlayer insulating layer, which are sequentially formed on a substrate; forming a mask layer comprising a via-hole masking pattern on the structure for via-hole etching; by using a first etching process, etching the structure for via-hole etching to a first thickness of the gate insulating layer; by using a second etching process, etching the structure for via-hole etching to etch away a remaining thickness of the gate insulating layer and uncovering the low-temperature poly-silicon layer; and removing the mask layer to form a via-hole structure.

For example, the first etching method is dry etching; the second etching method is dry etching with an organic etching gas, which is a mixed gas including $CF_4$, $H_2$, $C_4F_8$, Ar and $O_2$.

For example, for the first and second etching processes, the etching-chamber pressure is between 0 and 20 mtorr, and the etching power is not less than 5000 W.

For example, the first thickness of the gate insulating layer is 700~1400 Å.

For example, the material of the gate insulating layer is any one or more materials from silicon nitride, silicon oxide and silicon carbide Further, the formed via-hole structure has a profile-angle of 55°~75°.

The via-hole etching method provided by the embodiment of the present invention employs two etching processes during formation of a via-hole, and thus can retain the low-temperature poly-silicon layer while forming a via-hole structure, and can form a favorable via-hole profile-angle. The via-hole etching method provides a simple processing procedure, as well as a favorable via-hole structure.

BRIEF DESCRIPTION OF THE DRAWINGS

In order to clearly illustrate the technical solutions in the embodiments of the invention or in the prior art, the drawings needed for the description of the embodiments or the prior art will be briefly described in the following; it is obvious that the described drawings are only related to some embodiments of the invention. Based on these accompanying drawings, those skilled in the art can obtain other drawing(s), without any inventive work.

DETAILED DESCRIPTION

An embodiment of the present invention provides a via-hole etching method, which overcomes the defects of an uncontrollable end point of a via-hole and an unfavorable profile-angle in a conventional via-hole etching method.

In the following description, for the purpose of illustration instead of limitation, details such as specific system structures, interfaces, techniques, are proposed for a thorough understanding of the present invention. However, the skilled in the art should understand, the present invention can also be achieved in other embodiments without these specific details. In other instances, detailed description is omitted for the well-known devices, circuits and methods, in order to avoid obscuration with the description of the prevent invention from unnecessary details.

Figure 1:
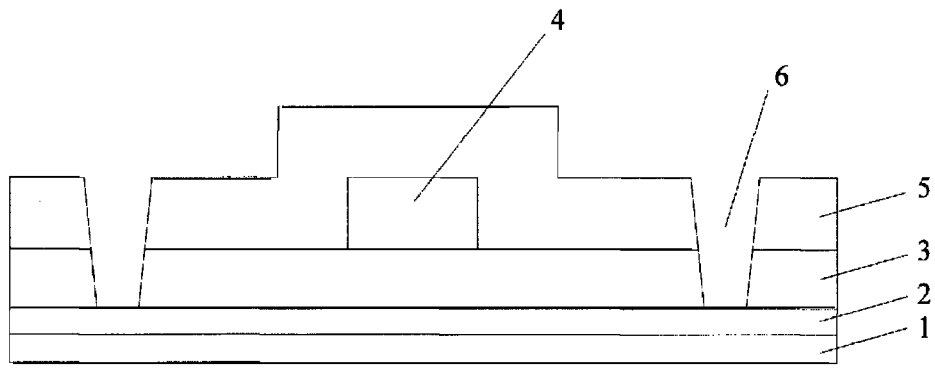
FIG. 1 is a final schematic structural diagram of a structure for via-hole etching according to an embodiment of the present invention.

However, the inventors have found that, the conventional technology at least has the following problems: for formation of a via-hole as illustrated in FIG. 1, a conventional via-hole etching method at least needs to etch a gate insulating layer and an interlayer insulating layer. Typically, a gate insulating layer and an interlayer insulating layer have a sum of their thicknesses, greater than 0.6 μm, whereas a low-temperature poly-silicon layer has a thickness less than 0.05 μm; therefore, the conventional via-hole etching method is prone to an over-etching phenomenon, which results in that the low-temperature poly-silicon is over-etched or even completely etched away, causing an adverse effect on the performance of the array substrate. On the other hand, the conventional method, which accomplishes preparation of a via-hole by a continuous multilayer etching process, probably incurs a problematic via-hole profile-angle. For example, at a transition position of adjacent film layers, since the conventional via-hole etching method has different etching rates for different film-layer materials, a step-like structure is formed on a via-hole, thus affecting the via-hole profile-angle. To eliminate the profile-angle problem, it further needs a wet etching process with a mixture of hydrofluoric acid and ammonia, which not only increases complexity of the etching processes, but also has a limited effect on repairing of the profile-angle.

Below, with reference to the drawings, an embodiment of the present invention will be described in detail.

A embodiment of the present invention provides a via-hole etching method, which comprises the following:

Step S101: forming a structure for via-hole etching.

Figure 2:
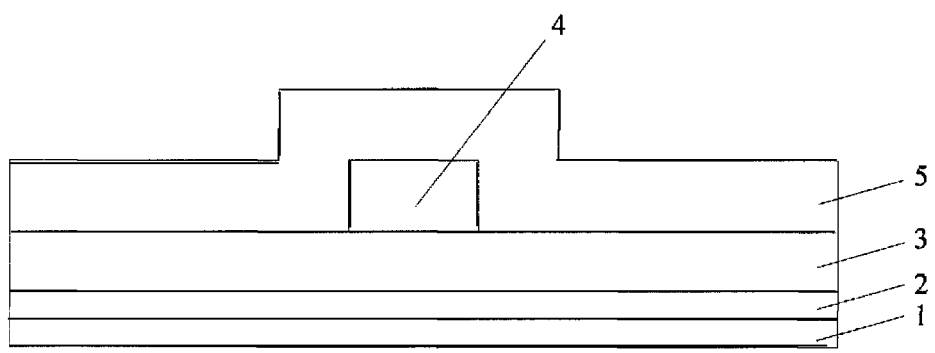
FIG. 2 is a first schematic structural diagram of the structure for via-hole etching according to an embodiment of the present invention.

As illustrated in FIG. 2, the structure for via-hole etching comprises: a substrate 1, a low-temperature poly-silicon layer 2, a gate insulating layer 3, a gate metal layer 4 and an interlayer insulating layer 5. It should be noted that, due to different array-substrate preparation processes, the formed structure for via-hole etching is not limited to the film-layer structure illustrated in FIG. 3. For example, on the interlayer insulating layer, there may further be provided with additional insulating film-layer structures, and in such case, the via-hole etching method of the embodiment of the present invention further needs to etch away the additional insulating film layers in addition to the gate insulating layer and the interlayer insulating layer. In this embodiment, it is explained by taking the case where the structure for via-hole etching only comprises therein a gate insulating layer and an interlayer insulating layer for example. The skilled in the art should understand that, the structure for via-hole etching and the preparation process thereof as mentioned herein do not impose a further limitation to the via-hole etching method of the embodiment of the present invention, and the description in this regard is omitted here.

Step S102: forming a mask layer comprising a via-hole masking pattern on the structure for via-hole etching.

Figure 3:
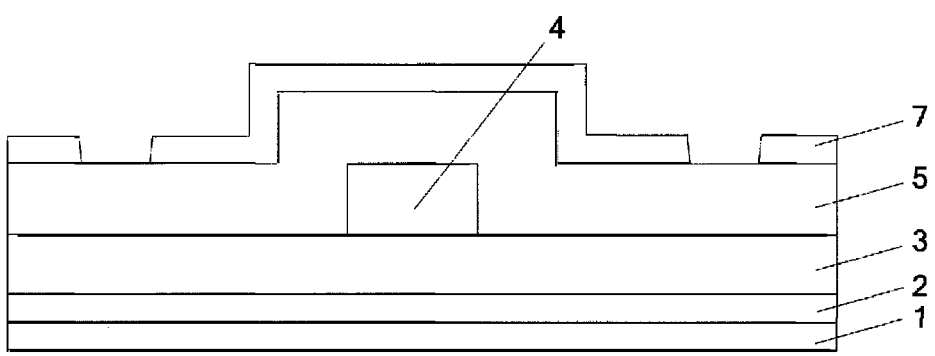
FIG. 3 is a second schematic structural diagram of the structure for via-hole etching according to an embodiment of the present invention.

As illustrated in FIG. 3, a mask layer 7 is formed on the structure for via-hole etching completed with the above step S101, and the mask layer 7 comprises therein a via-hole masking pattern for forming a via-hole. For example, a masking material is spin-coated on the structure for via-hole etching illustrated in FIG. 2, and through a patterning process, a mask layer comprising a via-hole masking pattern is generated. In this embodiment of the present invention, the patterning process comprises steps such as photoresist-coating, exposing, developing, etching, photoresist removing, etc.

Step S103: by using a first etching process, etching the structure for via-hole etching to a first thickness of the gate insulating layer.

Figure 4:
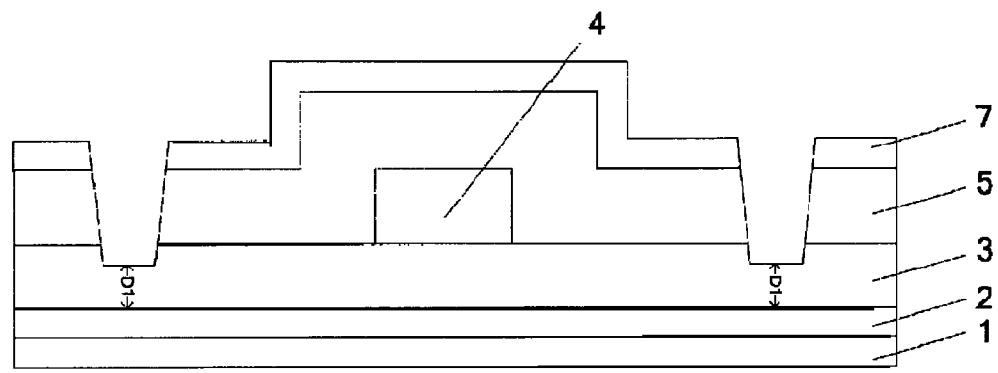
FIG. 4 is a third schematic structural diagram of the structure for via-hole etching according to an embodiment of the present invention.

The structure for via-hole etching completed after the above step S102 is etched by using a first etching method. For example, the first etching process may comprise dry etching. As illustrated in FIG. 4, by using the first etching process, the structure for via-hole etching is etched, and the etching process is ended at a first thickness of the gate insulating layer 3. The first thickness of the gate insulating layer is defined as D1. For example, the first thickness D1 may be 700~1400 Å. Through the first etching process, the structure for via-hole etching is formed into a structure as illustrated in FIG. 4.

For example, for the first etching process, the etching-chamber pressure is between 0 and 20 mtorr, and the etching power is not less than 5000 W.

It should be noted that, because the first etching process is ended at the first thickness of the gate insulating layer, the first etching process at least needs to etch the interlayer insulating layer and a part of the gate insulating layer; if the structure for via-hole etching further comprises therein an additional insulating layer on the interlayer insulating layer, then the first etching process also needs to etch away the additional insulating layer.

Step S104: by using a second etching process, etching the structure for via-hole etching to etch away the remaining thickness of the gate insulating layer, thus uncovering the low-temperature poly-silicon layer.

Figure 5:
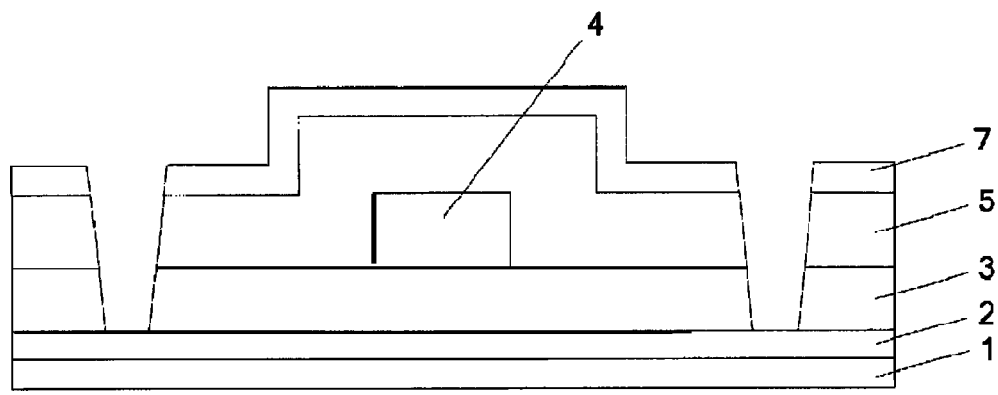
FIG. 5 is a fourth schematic structural diagram of the structure for via-hole etching according to an embodiment of the present invention.

For example, the structure for via-hole etching after the above step S103 is subjected to a second etching process. By using the second etching process, the structure for via-hole etching is etched, so that the second etching process etches away the remaining gate insulating layer after the above steps, thus uncovering the low-temperature poly-silicon layer. That is, the second etching process etches away the remaining first-thickness gate insulating layer after the above step, and the second etching process is ended at a corresponding position of the low-temperature poly-silicon layer. Through the second etching process, the structure for via-hole etching is formed into a structure as illustrated in FIG. 5.

For example, the second etching process may comprise dry etching with an organic etching gas, and the organic etching gas is a mixed gas including $CF_4$, $H_2$, $C_4F_8$, Ar and $O_2$. It should be noted that, dry etching with the above-mentioned organic etching gas can provide the second etching process with higher etching-selectivity, so that the second etching process can maximally retain the low-temperature poly-silicon layer, while etching away the gate insulating layer.

For example, for the second etching process, the etching-chamber pressure is between 0 and 20 mtorr, and the etching power is not less than 5000 W.

Step S105: removing the mask layer and forming a via-hole structure.

For example, the structure for via-hole etching after the above step S104 is subjected to a peeling-off process, so that the masking material of the mask layer is removed, thus forming a via-hole structure on the structure for via-hole etching. In this way, the structure for via-hole etching is formed into a structure as illustrated in FIG. 1.

For example, for the gate insulating layer mentioned in the embodiment of the present invention, its material may be any one or more materials from silicon nitride, silicon oxide and silicon carbide, or may be other insulating material(s) commonly used by the skilled in the art.

For example, in the embodiments of the present invention, the via-hole structure, formed through the via-hole etching processes, has a profile-angle of 55°~75°.

The embodiments of the present invention provide a via-hole etching method, and the via-hole etching method has a relatively simple procedure, which uses two etching processes during formation of a via-hole. Through the first and second etching processes, the low-temperature poly-silicon layer is retained during formation of a via-hole structure, which overcomes the defect of the conventional technology that it is prone to over-etching of the low temperature poly-silicon layer; meanwhile, the use of dry etching process ensures that the formed via-hole has a favorable profile-angle.

While the above are merely implementations of the present invention, the scope of the present invention is not limited thereto. Within the technical scope disclosed by the invention, modifications or alterations that can be easily devised by those skilled who are familiar with the art, should all be included within the scope of the present invention. Accordingly, the scope of the invention should be defined by the scope of the claims of the present invention.

The invention claimed is:

1. A via-hole etching method, comprising:
   forming a structure for via-hole etching, comprising a low-temperature poly-silicon layer, a gate insulating layer, a gate metal layer and an interlayer insulating layer, which are sequentially formed on a substrate;
   forming a mask layer comprising a via-hole masking pattern on the structure for via-hole etching;
   by using a first etching process, etching the structure for via-hole etching to a first thickness of the gate insulating layer;
   by using a second etching process, etching the structure for via-hole etching to etch away a remaining thickness of the gate insulating layer uncovering the low-temperature poly-silicon layer and ending the second etching process so as to retain the low-temperature poly-silicon layer that is uncovered; and
   removing the mask layer to form a via-hole structure;
   wherein the second etching process is dry etching with an organic etching gas, which is a mixed gas including $CF_4$, hydrogen ($H_2$), $C_4F_8$, Ar and $O_2$.

2. The via-hole etching method according to claim 1, wherein the first etching process is dry etching.

3. The via-hole etching method according to claim 1, wherein for the first and second etching processes, an etching-chamber pressure is between 0 and 20 mtorr, and an etching power is not less than 5000 W.

4. The via-hole etching method according to claim 1, wherein a first thickness of the gate insulating layer is 700~1400 Å.

5. The via-hole etching method according to claim 1, wherein a material of the gate insulating layer is any one or more materials from silicon nitride, silicon oxide and silicon carbide.

6. The via-hole etching method according to claim 1, wherein the formed via-hole structure has a profile-angle of 55°~75°.

7. The via-hole etching method according to claim 2, wherein for the first and second etching processes, an etching-chamber pressure is between 0 and 20 mtorr, and an etching power is not less than 5000 W.

8. The via-hole etching method according to claim 2, wherein a first thickness of the gate insulating layer is 700~1400 Å.

9. The via-hole etching method according to claim 2, wherein a material of the gate insulating layer is any one or more materials from silicon nitride, silicon oxide and silicon carbide.

10. The via-hole etching method according to claim 2, wherein the formed via-hole structure has a profile-angle of 55°~75°.

11. The via-hole etching method according to claim 3, wherein a first thickness of the gate insulating layer is 700~1400 Å.

12. The via-hole etching method according to claim 3, wherein a material of the gate insulating layer is any one or more materials from silicon nitride, silicon oxide and silicon carbide.

13. The via-hole etching method according to claim 3, wherein the formed via-hole structure has a profile-angle of 55°~75°.

14. The via-hole etching method according to claim 4, wherein a material of the gate insulating layer is any one or more materials from silicon nitride, silicon oxide and silicon carbide.

15. The via-hole etching method according to claim 4, wherein the formed via-hole structure has a profile-angle of 55°~75°.

16. The via-hole etching method according to claim 5, wherein the formed via-hole structure has a profile-angle of 55°~75°.

* * * * *